United States Patent
McEvoy et al.

(10) Patent No.: US 6,926,387 B2
(45) Date of Patent: Aug. 9, 2005

(54) ELECTRODES FOR A DROP-ON DEMAND PRINTER

(75) Inventors: Paul McEvoy, Hertfordshire (GB); Daniel Richard Mace, Cambridge (GB); Guy Charles Fernley Newcombe, Cambridge (GB); Andrew John Clippingdale, Cambridge (GB)

(73) Assignee: Tonejet Limited, Hertfordshire (GB)

( * ) Notice: Subject to any disclaimer, the term of this patent is extended or adjusted under 35 U.S.C. 154(b) by 25 days.

(21) Appl. No.: 10/466,632

(22) PCT Filed: Dec. 5, 2001

(86) PCT No.: PCT/GB01/05375

§ 371 (c)(1),
(2), (4) Date: Jul. 18, 2003

(87) PCT Pub. No.: WO02/057085

PCT Pub. Date: Jul. 25, 2002

(65) Prior Publication Data

US 2004/0051758 A1 Mar. 18, 2004

(30) Foreign Application Priority Data

Jan. 18, 2001 (EP) .............................................. 01300419

(51) Int. Cl.⁷ ................................................. B41J 2/06
(52) U.S. Cl. ....................................................... 347/54
(58) Field of Search .......................... 347/55, 151, 120, 347/141, 154, 103, 123, 111, 159, 127, 128, 131, 125, 158; 399/271, 290, 292, 293, 294, 295

(56) References Cited

U.S. PATENT DOCUMENTS

| 5,287,622 A | | 2/1994 | Terai ......................... 29/890.1 |
| 5,367,280 A | * | 11/1994 | Thiel et al. .................. 337/297 |
| 2002/0126182 A1 | * | 9/2002 | Miyamoto .................... 347/63 |

FOREIGN PATENT DOCUMENTS

| EP | 0 838 335 A2 | 4/1998 |
| EP | 0 869 003 A2 | 10/1998 |
| JP | 64-031650 | 2/1989 |

* cited by examiner

Primary Examiner—Raquel Yvette Gordon
(74) Attorney, Agent, or Firm—Dykema Gossett PLLC

(57) ABSTRACT

The invention provides a drop-on-demand printer having a row of ink ejection locations for ejecting plural ink droplets, each ejection location having an associated ejection electrode for causing electrostatic ejection of the droplets from the respective ejection location. An intermediate electrode system has one or more rows of intermediate electrodes 3 spaced from the ejection locations between the ejection locations and a substrate on to which the droplets are printed during use. Plural conductive tracks 5 are provided, each corresponding to a respective intermediate or ejection electrode 3 and supplying a voltage to an electrode in use. Tracks 5 have a resistive element 14 either disposed immediately adjacent the corresponding electrode or actually forming the electrode 3.

12 Claims, 3 Drawing Sheets

Figure 5A:
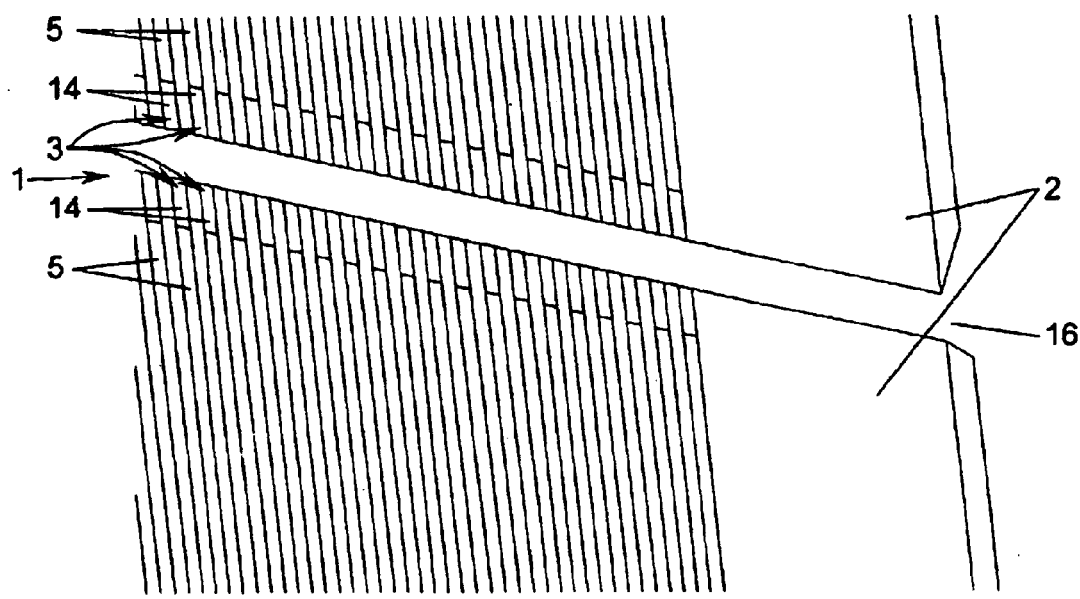

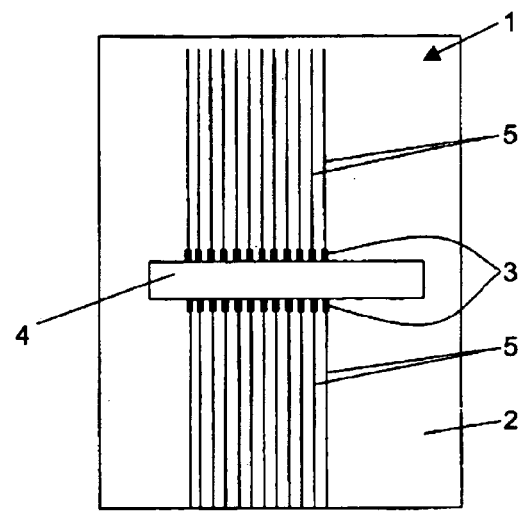
Fig. 1
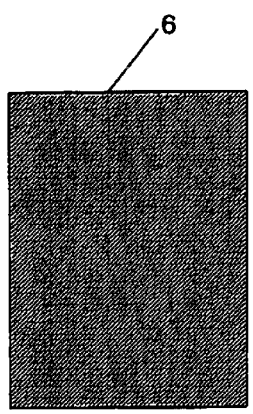 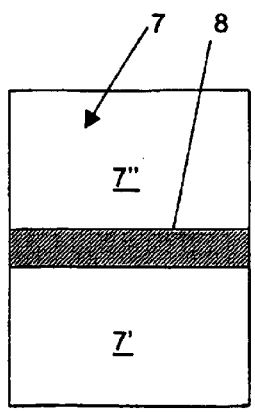 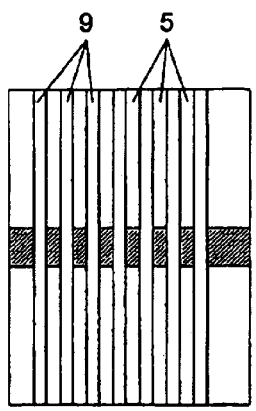 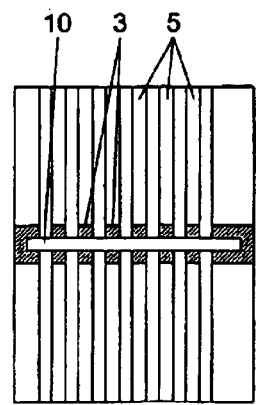
Fig. 2A  Fig. 2B  Fig. 2C  Fig. 2D

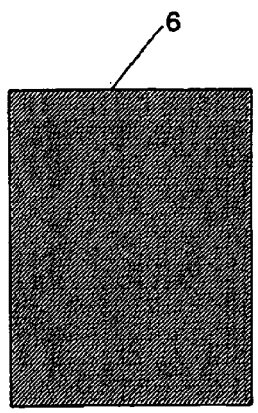
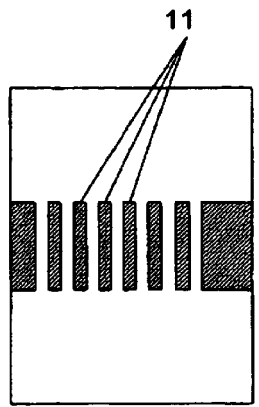
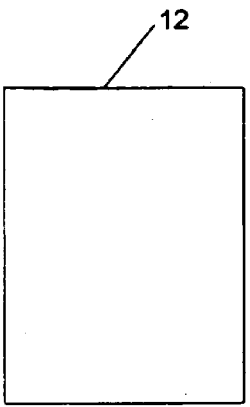
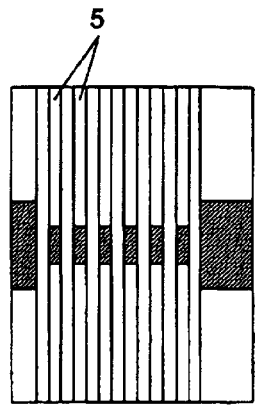
Fig. 3A     Fig. 3B     Fig. 3C     Fig. 3D
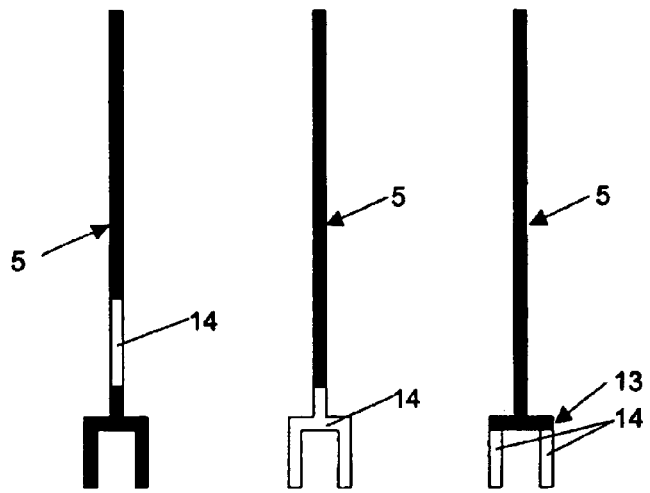
Fig. 4A     Fig. 4B     Fig. 4C

ELECTRODES FOR A DROP-ON DEMAND PRINTER

The present invention relat s to electrodes for a drop-on-demand printer of th type described in WO-A-93-11866 and, more particularly in WO-A-97-27056, in which agglomeration or concentration of particles is achieved at an ejection location and from the ejection location particles are then ejected on to a substrate for printing purposes. In the case of an array printer, plural cells, each containing an ejection location, may be arranged in one or more rows.

In WO-A-97-27056 we describe an apparatus which includes a plurality of ejection locations disposed in a linear array, each ejection location having a corresponding ejection electrode so that the ejection electrodes are disposed in a row defining a plane. One or more secondary electrodes are disposed transverse to the plane of the ejection electrodes so that the sensitivity of the apparatus to influence by external electric fields can be reduced. The sensitivity to variations in the distance between the ejection location and the substrate on to which the particles are ejected is also reduced. The secondary electrode is preferably disposed between the ejection electrodes and the substrate and may comprise a planar electrode containing a central slit through which particles are ejected on to the substrate. Conventionally, the secondary or "intermediate" electrode is held at a constant voltage.

However, by forming plural intermediate electrodes at the same pitch as the pitch of the ejection locations, the field at each ejection point can be altered by pulsing the voltage applied to respective intermediate electrodes enabling the pulse voltage applied to the ejection electrode to be reduced.

In order to eliminate any risk of electrical breakdown that may occur between the ejection electrodes and the intermediate electrodes causing misprinting it has previously been considered to provide a resistor between the intermediate electrodes and the corresponding power supply. We have discovered that, unfortunately, the capacitive load of the metal tracks of the intermediate electrodes causes the rise time of the applied pulses to be unacceptably large. For example, if the capacitance per millimetre of th metal conductive tracks is 0.2 $pF.mm^{-1}$ and the tracks are about 10 mm long then a 10 MΩ resistor would result in a rise time of about 20 $\mu s$. In printers of the type to which the present invention relates pulse lengths can be of the order of 50 $\mu s$.

According to the present invention therefore there is provided a drop-on-demand printer having a row of ink ejection locations for ejecting plural ink droplets, each ejection location having an associated ejection electrode for causing electrostatic ejection of the droplets from the respective ejection location; an interm diate lectrod system having a row of intermediate electrodes spaced from the row of jection locations, and in us disposed betw en the row of ejection locations and a substrate on to which th droplets are print d during use, a plurality of conductive tracks, each corresponding to a respective intermediate electrode for supplying a voltage to each intermediate lectrode in us, and each conductive track including a resistive element disposed immediately adjacent the corresponding intermediate electrode.

According to a second aspect of the present invention there is provided a drop-on-demand printer having a row of ink ejection locations for ejecting plural ink droplets, each ejection location having an associated ejection electrode for causing electrostatic ejection of the droplets from the respective ejection location; an intermediate electrode system having a row of intermediate electrodes spaced from the row of ejection locations, and in use disposed between the row of ejection locations and a substrate on to which the droplets are printed during use, a plurality of conductive tracks, each corresponding to a respective intermediate electrode for supplying a voltage to each intermediate electrod in use, each intermediate electrode consisting of a resistive element.

The invention also includes a drop-on-demand printer having a row of ink ejection locations for ejecting plural ink droplets, each ejection location having an associated ejection electrode for causing electrostatic ejection of the droplets from the respective ejection, location a plurality of conductive tracks, each corresponding to a respective ejection electrode for supplying a voltage to each ejection electrode in use, and each conductive track including a resistive element disposed immediately adjacent the corresponding ejection electrode.

Further the invention includes a drop-on-demand printer having a row of ink ejection locations for ejecting plural ink droplets, each ejection location having an associated ejection electrode for causing electrostatic ejection of the droplets from the respective ejection location and may have a corresponding intermediate electrode or electrodes; a plurality of conductive tracks, each corresponding to a respective ejection location, for supplying a voltage to ejection electrode and/or each intermediate electrode in use, each ejection electrode and/or each intermediate electrode consisting of a resistive element.

By forming the resistive element adjacent to the corresponding electrode or actually as the electrode, the pulse rise time is capable of being significantly reduced, for example, to a little as 1 $\mu s$.

The invention further includes a method of manufacturing an electrode system for a printer, the method comprising forming a layer of resistive material on a non-conductive substrate; masking an elongate region of the resistive material layer; forming a layer of conductive material on the unmasked area of the layer of resistive material; removing strips of the layers of resistive material and conductive material substantially transv rse to and extending across the elongate region of the resistive layer to define a plurality of conductive tracks having resistiv end portions.

Preferably the masked elongate region of the resistiv layer comprises a section of the resistive layer remote from the edges of the substrate and the strips of the layers of resistive material which are removed extend across the section, the method including cutting a slot in the section substantially parallel with the longitudinal axis of the section and of lesser width than the section, thereby forming a plurality of opposed electrodes on opposite sides of the slot.

In an alternative method of manufacturing an electrode system, the method comprises forming a layer of resistive material on a non-conductive substrate; selectively removing areas of the resistive material layer to form a plurality of parallel strips of resistive material; forming a layer of conductive material over the substrate on top of the layer of resistive material; removing strips of the layer of conductive material over the areas of the substrate from which the resistive material layer has been removed, to define a plurality of conductive tracks having resistive end portions.

Preferably, in that method, the plurality of parallel strips of resistive material are disposed in a section remote from the edges of the substrate, the method including cutting a slot in the section substantially parallel with the longitudinal axis of the section and of lesser width than the section, thereby forming a plurality of opposed electrodes on opposite sides of the slot.

Examples of addressable intermediate electrodes of a printer according to the present invention and their methods of manufacture, will now be described with reference to the accompanying drawings in which:

FIG. 1 is a diagrammatic plan view of an intermediate electrode array;

FIGS. 2A–D illustrate stages in the manufacture of such an electrode array;

FIGS. 3A–D illustrate an alternative method of manufacture;

FIGS. 4A–C show three different styles of intermediate electrode; and

Figure 5B:
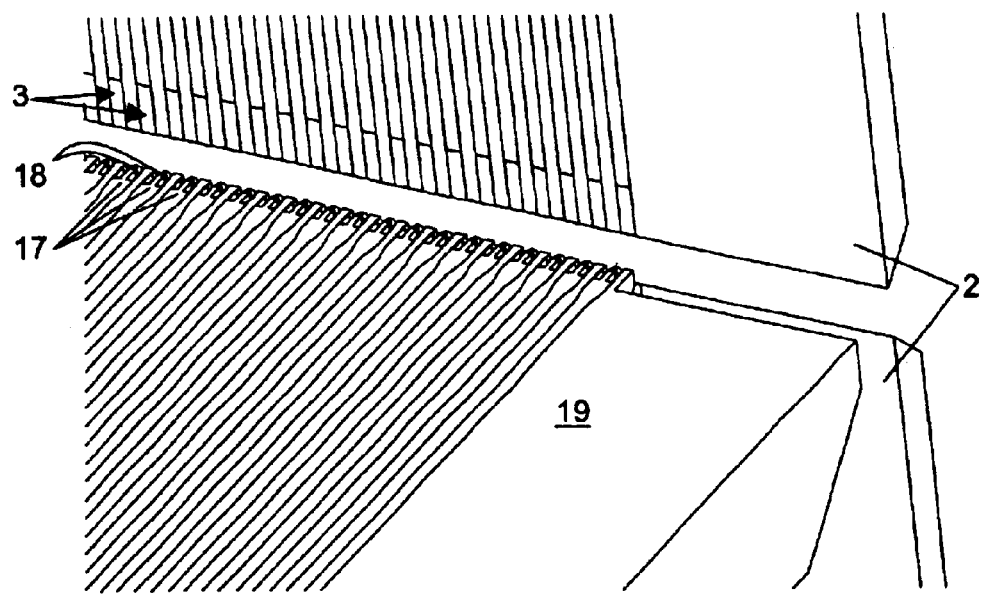

FIGS. 5A & 5B are isometric views of a printer incorporating such intermediate electrodes.

FIG. 1 shows an addressable intermediate electrode array 1 which is formed on a ceramic or similarly non-conductive substrate 2, each addressable intermediate electrode 3 being one of a pair, the electrodes of each pair being located on opposite sides of an elongate slit 4 extending through the substrate 2. FIG. 1 illustrates plural metallic, conductive tracks 5 (typically a chrome base layer of say 20 nm thickness, with a gold top layer of say 300 nm thickness) extending to respective electrodes 3 on the surface of the substrate 2. At the end of each metal track the actual electrode 3 is formed of a resistive element (say of amorphous silicon which may have a resistivity of 0.5 to 20Ω.m).

FIGS. 2A–D illustrate one method of manufacture. In this method the ceramic substrate 2 is coated with a resistive material 6 and then a furth r metal and therefore conductive layer 7 is deposited on to the resistive material in two sections 7', 7", leaving a gap 8 between them (of approximately 1 mm width).

In the next stage (see FIG. 2C) slots or grooves 9 are cut through the metal and conductive layers 7, 6 substantially at right angles thereby separating sections of the layers into the tracks 5 and in the final stage of the process (see FIG. 2D) a slit 10 is cut through the layers 6, 7 and the substrate 2, in alignment with the gap 8 between the conductive areas 7', 7" thereby creating plural resistive electrodes 3 at the ends of the tracks 5 on each side of the slit 10.

In an alternative method shown in FIGS. 3A–3D resistive material 6 is deposited on to a ceramic tile as in the process described with reference to FIGS. 2A–2D and in a second stage (see FIG. 3B) the resistive material is patterned lithographically with a photoresist which is then developed, the surface then being etched to remove undesired resistive materials. Plural bands or stripes 11 of resistive material are thereby left on the substrate 2. In the next stage of the process the substrate 2 is coated with a conductiv metal layer 12 and then the metal is patterned lithographically using a method similar to that used for the resistive material and again the photoresist is exposed and then unwanted metal is removed so as to leave conductive tracks 5 as shown. Thereafter, a slit is cut in the same way as described with reference to FIG. 2D, leaving a very similar structure, but one in which the resistive material does not underlie the full length of the tracks 5.

Other alternative methods of manufacture may be used such as, by way of example only, lithography of a photoresist followed by deposition and lift-off, or blanket deposition in combination with patterning by lithography. In one method, metal conductors may be laid down on a substrate by lithographic patterning, to form arrays of opposing tracks with gaps formed in each of the metal tracks thus formed. Strips of resistive material are deposited by for example screen printing along the gaps in the conductiv tracks, and the resistors are then separated by cutting through the resistive material using a micro-mechanical saw, laser ablation or other suitable method.

In another method, a photo-imageable thick film resistive material is printed onto the substrate in bands along the gaps in the conductive tracks, the resistive material then being exposed to ultraviolet light through a mask so that the material is cured in the gaps but uncured in the spaces between the conductive tracks, and the unexposed film then rinsed away. This method can also be used to form tracks terminated by accurately positioned resistors.

A still further option is to manufacture the tracks (by an appropriate method) from highly doped silicon and vary the degree of doping along the length of the tracks to create the respective conductive and resistive portions as desired.

FIGS. 4A–C illustrate the ends of conductiv tracks at which the electrodes 3 are formed, the conductive tracks 5 being bifurcated as shown at 13. The resistive elements 14 may be located, for example, as shown in any of FIGS. 4A–4C.

FIG. 5A is an isometric view of an intermediate electrode array 1 in a printer, showing two opposed sets of electrodes 3 and conductive tracks 5 with their respective resistive elements 14 (formed on a ceramic substrate 2), one on each side of a gap 16, through which printing occurs in use. FIG. 5B illustrates the printer in further detail, showing the positioning of the individual ejection cells 17 with their associated ejection tips 18 in registration with corresponding ones of the intermediate electrodes 3 and arranged to eject through the gap 16, the cells 17 being formed on a separate ceramic or other non-conductive substrate 19, for example of the construction described in our PCT/GB00/04121.

What is claimed is:

1. A drop-on-demand printer having
 a row of ink ejection locations for ejecting plural ink droplets, each ejection location having an associated ejection electrode for causing electrostatic ejection of the droplets from the respective ejection location;
 an intermediate electrode system having
  a row of intermediate electrodes spaced from the row of ejection locations, and in use disposed between the row of ejection locations and a substrate on to which the droplets are printed during use,
  a plurality of conductive tracks, each corresponding to a respective intermediate electrode for supplying a voltage to each intermediate electrode in use, and each conductive track including a resistive element disposed immediately adjacent the corresponding intermediate electrode.

2. A printer according to claim 1 or claim 2, wherein one or more of the intermediate electrodes are bifurcated.

3. A printer according to any of claim 1, wherein plural intermediate electrodes are formed on each side of an aperture in a substrate on which the intermediate electrodes and conductive tracks are formed.

4. A method of manufacturing an electrode system for a printer, of claim 1, the method comprising
 forming a layer of resistive material on a non-conductive substrate;
 masking an elongate region of the resistive material layer;
 forming a layer of conductive material on the unmasked area of the layer of resistive material;
 removing strips of the layers of resistive material and conductive material substantially transverse to and extending across the elongate region of the resistive layer to define a plurality of conductive tracks having resistive end portions.

5. A method according to claim 4, wherein
 the masked elongate region of the resistive layer comprises a section of the resistive layer remote from the edges of the substrate and the strips of the layers of resistive material which are removed extend across the section, the method including cutting a slot in the section substantially parallel with the longitudinal axis of the section and of lesser width than the section, thereby forming a plurality of opposed electrodes on opposite sides of the slot.

6. A method of manufacturing an electrode system for a printer of claim 1, the method comprising forming a layer of resistive material on a non-conductive substrate;

selectively removing areas of the resistive material layer to form a plurality of parallel strips of resistive material;

forming a layer of conductive material over the substrate on top of the layer of resistive material;

removing strips of the layer of conductive material over the areas of the substrate from which the resistive material layer has been removed, to define a plurality of conductive tracks having resistive end portions.

7. A method according to claim 6, wherein the plurality of parallel strips of resistive material are disposed in a section remote from the edges of the substrate, the method including cutting a slot in the section substantially parallel with the longitudinal axis of the section and of lesser width than the section, thereby forming a plurality of opposed electrodes on opposite sides of the slot.

8. A drop-on-demand printer having a row of ink ejection locations for electing plural ink droplets, each ejection location having an associated election electrode for causing electrostatic ejection of the droplets from the respective ejection location;

an intermediate electrode system having a row of intermediate electrodes spaced from the row of ejection locations, and in use disposed between the row of ejection locations and a substrate on to which the droplets are printed during use, a plurality of conductive tracks, each corresponding to a respective intermediate electrode for supplying a voltage to each intermediate electrode or ejection electrode in use, each intermediate electrode consisting of a resistive element.

9. A drop-on-demand printer having a row of ink ejection locations for ejecting plural ink droplets, each ejection location having an associated ejection electrode for causing electrostatic ejection the droplets from the respective ejection location;

a plurality of conductive tracks, each corresponding to a respective ejection electrode for supplying a voltage to each ejection electrode in use, and each conductive track including a resistive element disposed immediately adjacent the corresponding ejection electrode.

10. A printer according to claim 9, wherein one or more of the ejection or intermediate electrodes are bifurcated.

11. A drop-on-demand printer having a row of ink ejection locations for ejecting plural ink droplets, each ejection location having an associated ejection electrode for causing electrostatic ejection of the droplets from the respective ejection location;

a plurality of conductive tracks, each corresponding to a respective ejection location for supplying a voltage to each ejection electrode in use, each ejection electrode consisting of a resistive element.

12. A drop-on-demand printer having a row of ink ejection locations for ejecting plural ink droplets, each ejection location having an associated ejection electrode for causing electrostatic ejection of the droplets from the respective ejection location;

a row of intermediate electrodes corresponding to the ejection locations; and, a plurality of conductive tracks, each corresponding to a respective ejection location for supplying a voltage to each intermediate electrode in use, each intermediate electrode comprising of a resistive element.

* * * * *